United States Patent
Shen et al.

(10) Patent No.: US 7,122,839 B2
(45) Date of Patent: Oct. 17, 2006

(54) SEMICONDUCTOR LIGHT EMITTING DEVICES WITH GRADED COMPOSITION LIGHT EMITTING LAYERS

(75) Inventors: Yu-Chen Shen, Sunnyvale, CA (US); Michael R. Krames, Mountain View, CA (US); Nathan F. Gardner, Mountain View, CA (US)

(73) Assignee: Philips Lumileds Lighting Company, LLC, San Jose, CA (US)

( * ) Notice: Subject to any disclaimer, the term of this patent is extended or adjusted under 35 U.S.C. 154(b) by 59 days.

(21) Appl. No.: 10/977,867

(22) Filed: Oct. 29, 2004

(65) Prior Publication Data

US 2006/0091404 A1    May 4, 2006

(51) Int. Cl.
*H01L 27/15*    (2006.01)

(52) U.S. Cl. .......................... 257/79; 257/103

(58) Field of Classification Search ................ 257/79, 257/94, 101, 103, 13
See application file for complete search history.

(56) References Cited

U.S. PATENT DOCUMENTS

| | | | |
|---|---|---|---|
| 6,515,313 B1 | 2/2003 | Ibbetson et al. | |
| 6,955,933 B1 * | 10/2005 | Bour et al. | 438/22 |
| 2003/0020085 A1 | 1/2003 | Bour et al. | |

* cited by examiner

*Primary Examiner*—Mark V. Prenty
(74) *Attorney, Agent, or Firm*—Patent Law Group LLP; Rachel V. Leiterman

(57) ABSTRACT

A III-nitride light emitting layer in a semiconductor light emitting device has a graded composition. The composition of the light emitting layer may be graded such that the change in the composition of a first element is at least 0.2% per angstrom of light emitting layer. Grading in the light emitting layer may reduce problems associated with polarization fields in the light emitting layer. The light emitting layer may be, for example $In_xGa_{1-x}N$, $Al_xGa_{1-x}N$, or $In_xAl_yGa_{1-x-y}N$.

20 Claims, 4 Drawing Sheets

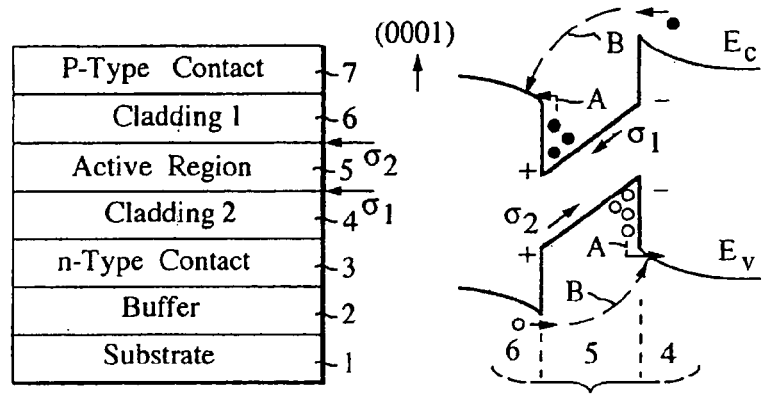
Fig. 1A
(Prior Art)
Fig. 1B
(Prior Art)
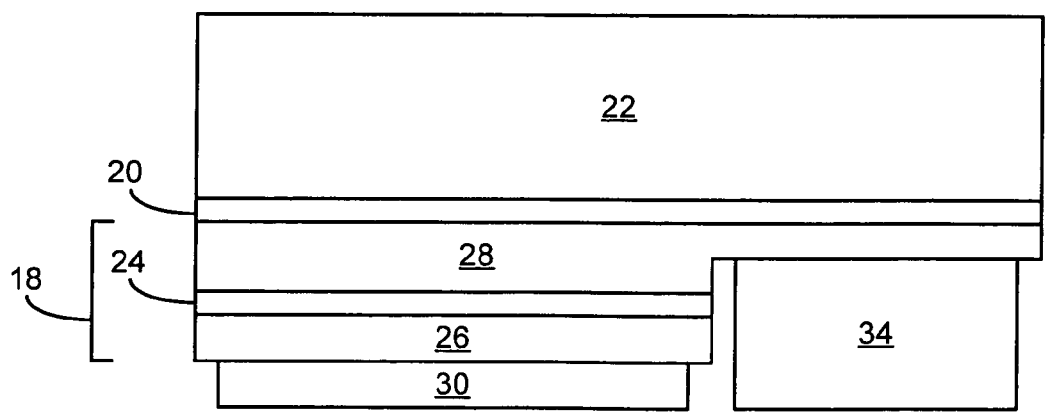
FIG. 2

SEMICONDUCTOR LIGHT EMITTING DEVICES WITH GRADED COMPOSITION LIGHT EMITTING LAYERS

BACKGROUND

1. Field of Invention

The present invention relates to semiconductor light emitting devices, and more particularly to improve the light output of the active region of a semiconductor light emitting device.

2. Description of Related Art

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, a light emitting or active region formed over the n-type layer or layers, and one or more p-type layers doped with, for example, Mg, formed over the active region. III-nitride devices formed on conductive substrates may have the p- and n-contacts formed on opposite sides of the device. Often, III-nitride devices are fabricated on insulating substrates, such as sapphire, with both contacts on the same side of the device. Such devices are mounted so light is extracted either through the contacts (known as an epitaxy-up device) or through a surface of the device opposite the contacts (known as a flip chip device).

The crystal layers in III-nitride devices are often grown as strained wurtzite crystals on lattice-mismatched substrates such as sapphire. Such crystals exhibit two types of polarization: spontaneous polarization, which arises from the crystal symmetry, and piezoelectric polarization, which arises from strain. The total polarization in a layer is the sum of the spontaneous and piezoelectric polarization.

FIG. 1A is a sectional view schematically illustrating a typical conventional strained wurtzite nitride double heterostructure semiconductor, described in U.S. Pat. No. 6,515,313. According to U.S. Pat. No. 6,515,313, the illustrated substrate layer 1 may be any material suitable for growing nitride semiconductors, including spinel ($MgAl_2O_4$), sapphire ($Al_2O_3$), SiC (including 6H, 4H, and 3C), ZnS, ZnO, GaAs, AlN and GaN. The substrate thickness typically ranges from 100 µm to 1 mm. A buffer layer 2 on the substrate 1 can be formed of AlN, GaN, AlGaN, InGaN or the like. The buffer layer accomodates possible lattice mismatches between the substrate 1 and an overlying conductive contact layer 3. However, the buffer layer 2 may be omitted if the substrate has a lattice constant approximately equal to that of the nitride semiconductor. The buffer layer 2 may also be omitted with some nitride growth techniques. Depending upon the material composition, the buffer layer energy bandgap may range from 2.1 eV to 6.2 eV, with a thickness of about 0.5 µm to 10 µm. See U.S. Pat. No. 6,515,313, column 2, lines 31–48.

The n-type contact layer 3 is also typically formed from a nitride semiconductor, preferably GaN or InGaN with a thickness ranging from 0.5 µm to 5.0 µm, and a bandgap of approximately 3.4 eV for GaN and less for InGaN (depending upon the Indium concentration). A lower n-type or undoped cladding layer 4 on the conductive layer 3 conventionally comprises GaN or AlGaN, with a bandgap of 3.4 eV for GaN and greater for AlGaN (depending upon the Al concentration). Its thickness can range from 1 nm to 100 nm. See U.S. Pat. No. 6,515,313, column 2, lines 49–58.

Nitride double heterostructures typically employ InGaN as an active region 5 over the lower cladding layer, with a thickness of 1 nm to 100 nm. The bandgap of this layer is typically 2.8 eV for blue emission, but may vary depending upon the Indium concentration. A top p-type or undoped cladding layer 6 over the active region is generally comprised of AlGaN or GaN, with a thickness and bandgap energy similar to that of the lower n-type cladding layer 4. A p-type GaN conductive contact layer 7 on the cladding layer 6 has an energy bandgap of about 3.4 eV and a thickness of about 10 nm to 500 nm. A polarization-induced sheet charge occurs at the interface between layers due to different constituent materials. Of particular concern for the operation of a light emitter are the polarization-induced sheet charges adjacent to the active region 5. See U.S. Pat. No. 6,515,313, column 2 line 59 to column 3 line 7.

With the compound semiconductor illustrated in FIG. 1A, a negative polarization-induced sheet charge density σ1, with a magnitude such as $10^{13}$ electrons/cm$^2$, is typically formed at the interface between the active region 5 and the lower cladding layer 4. A positive sheet charge density σ2 of similar magnitude is formed at the interface between the active region 5 and the upper cladding layer 6. The polarities and magnitudes of these charges depend upon the crystal symmetry and composition differences of the crystal layers. In general, the density of a sheet charge will depend upon both the spontaneous polarization and the piezoelectric polarization due to strain between the two adjacent layers. For example, σ1 between an $In_{0.2}Ga_{0.8}N$ active region 5 and a GaN cladding layer 4 is about $8.3 \times 10^{12}$ electrons/cm$^2$. See U.S. Pat. No. 6,515,313, column 3, lines 8–26.

FIG. 1B illustrates the energy bands corresponding to the device structure of FIG. 1A. When the device is operating, the naturally occurring polarization field across the quantum well generated by σ1 and σ2 reduces the efficiency in a number of ways. First, the electric field in the quantum well leads to a spatial separation (movement in the opposite direction) of electrons and holes within the region. As illustrated, holes in the valence band $E_v$ are attracted to the negative sheet charge σ1 at one end of the active region 5, while electrons in the conduction band $E_c$ are attracted to the positive sheet charge σ2 at its other end. This spatial separation of carriers lowers the probability of radiative recombination, reducing light emission efficiency. Second, the energy barriers of the conduction and valence band are reduced by tilting of the band associated with the electric field. Thus, carriers below $E_v$ and above $E_c$ escape the well through the paths indicated by dashed lines A. Third, the presence of polarization-induced fields also leads to carrier overshoots, illustrated by carrier trajectories B, from the higher $E_c$ level on the σ1 side of the active region to the lower $E_c$ level on the σ2 side, and from the lower $E_v$ level on the σ2 side of the active region to the higher $E_v$ level on the σ1 side. See U.S. Pat. No. 6,515,313, column 3, line 56 to column 4 line 10.

Another issue of concern for applications engineers is the stability of the emission wavelength as the applied bias is increased. If strong polarization-induced fields are present, the emission wavelength will blue-shift as the device bias is increased. As the device bias is increased, more carriers accumulate in the conduction and valence band wells. Since the carriers are spatially separated, they will themselves form a dipole that opposes, or screens, the built-in polarization induced field. As the net electric field is reduced, the quantized energy states of the quantum wells change, resulting in a blue-shift of the emission wavelength. See U.S. Pat. No. 6,515,313, column 4, lines 11–21.

In order to reduce or cancel the effect of the crystal's naturally occurring polarization induced charges to improve carrier confinement, to reduce their spatial separation, and to reduce carrier overshoot, U.S. Pat. No. 6,515,313 proposes that one or more layers in or around the active region be graded in composition or doping to generate space charges that oppose the polarization-induced charges. Specifically, at column 10, lines 31–34, U.S. Pat. No. 6,515,313 teaches "the active region has a continuously graded Indium concentration from a low of 5% to a high of 10%, with a gradient of approximately 1%/nm" or 0.1%/Å.

Published U.S. Application 2003/0020085, application Ser. No. 09/912,589, filed Jul. 24, 2001, assigned to the assignee of the present application, and incorporated herein by reference, also proposes composition grading in the active region. Paragraph [0036] teaches "quantum well layer 40 is about 40 Å thick, and the mole fraction of indium in $In_xGa_{1-x}N$ quantum well layer 40 grades linearly from a mole fraction of about x=0.4 near its interface with barrier layer 38 to a mole fraction of about x=0 near its interface with barrier layer 42[,]" corresponding to a grading slope or gradient of 1%/Å.

SUMMARY

In accordance with embodiments of the invention, a III-nitride light emitting layer in a semiconductor light emitting device has a graded composition. The composition of the light emitting layer may be graded such that the change in the composition of a first element is at least 0.2% per angstrom of light emitting layer. Grading in the light emitting layer may reduce problems associated with polarization field in the light emitting layer. The light emitting layer may be, for example, $In_xGa_{1-x}N$, $Al_xGa_{1-x}N$, or $In_xAl_yGa_{1-x-y}N$.

BRIEF DESCRIPTION OF THE DRAWINGS

FIGS. 1A and 1B are a cross sectional view and an energy band diagram of a portion of a prior art light emitting device described in U.S. Pat. No. 6,515,313.

FIG. 2 is a cross sectional view of a light emitting device according to embodiments of the invention.

DETAILED DESCRIPTION

Figure 3:
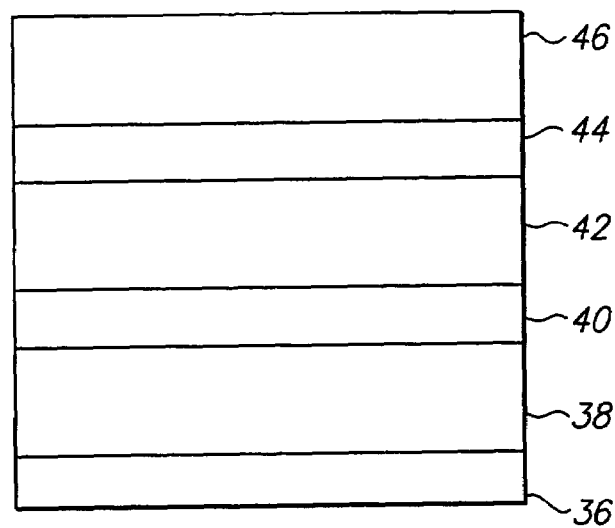
FIG. 3 is a cross sectional view of an active region of FIG. 2, according to embodiments of the invention.

In accordance with embodiments of the present invention, the active region of a semiconductor light emitting device includes a semiconductor alloy with a graded composition. Several embodiments will be described in which the active region includes one or more graded composition quantum well layers. In the notation $In_xAl_yGa_{1-x-y}N$, $0 \leq x \leq 1$, $0 \leq y \leq 1$, and $x+y \leq 1$.

Referring to FIG. 2, in one embodiment an $In_xAl_yGa_{1-x-y}N$ based LED includes a multilayered epitaxial structure 18 disposed on a buffer layer 20, which in turn is disposed on substrate 22, such as sapphire, SiC, or any other suitable substrate. Epitaxial structure 18 includes active region 24 disposed between p-type $In_xAl_yGa_{1-x-y}N$ region 26 and $In_xAl_yGa_{1-x-y}N$ region 28. $In_xAl_yGa_{1-x-y}N$ region 28 includes n-type and/or undoped $In_xAl_yGa_{1-x-y}N$ layers. Active region 24 includes one or more quantum well layers and one or more barrier layers formed from $In_xAl_yGa_{1-x-y}N$. P-contact 30 is electrically coupled to $In_xAl_yGa_{1-x-y}N$ region 26. N-contact 34 is electrically coupled to $In_xAl_yGa_{1-x-y}N$ region 28. Application of a suitable forward bias across contacts 30 and 34 results in emission of light from active region 24.

Referring to FIG. 3, in one embodiment active region 24 includes $In_xGa_{1-x}N$ quantum well layers 36, 40, and 44, and GaN or InGaN barrier layers 38, 42, and 46, with quantum well layer 36 located closest to substrate layer 22 (FIG. 2). Quantum well layers 36, 40, and 44 are about 10 Angstroms (Å) to about 100 Å (typically about 30 Å) thick. Barrier layers 38, 42, and 46 are about 25 A to about 500 Å (typically about 100 Å) thick. Although FIG. 3 shows three quantum well layers and three barrier layers, in other embodiments active region 24 includes a single light emitting layer with no barrier layers, or more or fewer quantum well and barrier layers than are illustrated in FIG. 3.

In one embodiment, the mole fraction of indium (subscript x in $In_xGa_{1-x}N$) in one or more of quantum well layers 36, 40, and 44 is graded to decrease with distance from the substrate. For example, the mole fraction of indium in quantum well layer 40 may decrease from a first value near the interface between quantum well layer 40 and barrier layer 38 to a second value near the interface between quantum well layer 40 and barrier layer 42. Generally, the compositions of each of quantum well layers 36, 40, and 44 are similarly graded, though this is not necessary.

The band gap of $In_xGa_{1-x}N$ decreases as the mole fraction of indium increases. In the absence of electric fields such as piezoelectric fields, for example, a graded indium concentration which decreases through a quantum well with distance from the substrate results in a graded band gap in the quantum well which increases with distance from the substrate. In such a case the conduction band edge energy in the quantum well would increase with distance from the substrate, and the valence band edge energy in the quantum well would decrease with distance from the substrate. Usually, however, epitaxial structure 18 has a (piezoelectric) wurtzite crystal structure with its c-axis oriented substantially perpendicular to and directed away from substrate 22. Hence, polarization fields are typically present in quantum wells 36, 40, and 44. Advantageously, a graded indium concentration which decreases through a $In_xGa_{1-x}N$ quantum well with distance from the substrate (that is, decreases in a direction substantially parallel to the wurtzite crystal c-axis) at least partially cancels the effect of the piezoelectric field on the conduction band edge in the quantum well. This cancellation can be understood as the result of the tilt of the conduction band edge due to the indium concentration gradient at least partially compensating for the tilt of the conduction band edge due to the piezoelectric fields.

Figure 4:
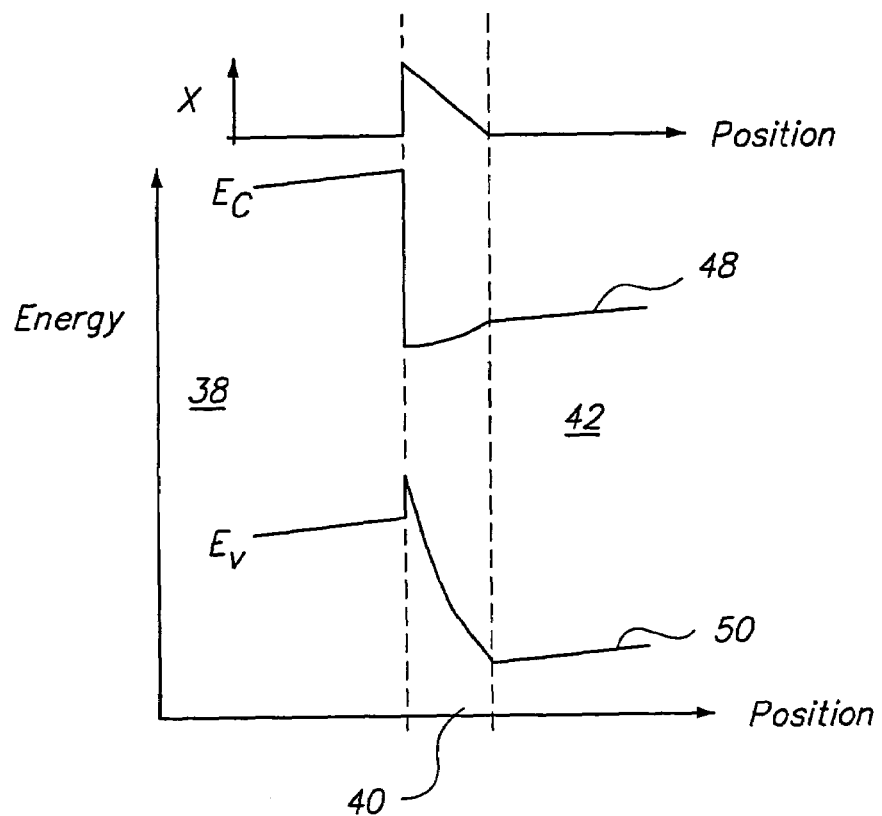
FIG. 4 illustrates a portion of a band structure for a first example of the active region illustrated in FIG. 3.

FIG. 4 shows a schematic band structure of a portion of active region 24 including GaN barrier layers 38 and 42 and an $In_xGa_{1-x}N$ quantum well layer 40 in an embodiment in which the mole fraction of indium in $In_xGa_{1-x}N$ quantum well layer 40 is graded linearly from a maximum value near its interface with barrier layer 38 to about zero near its interface with barrier layer 42. The tilt of conduction band edge 48 in quantum well layer 40 has been substantially reduced compared to the tilt of conduction band edge 48 of prior art quantum well layer 5 in FIG. 1.

The tilt of valence band edge 50 in thin quantum well layer 40, however, is similar to or slightly increased with respect to that in an ungraded quantum well layer. The tilt of valence band edge 50 can be understood as the result of the tilt of the valence band edge 50 due to the indium concentration gradient adding to the tilt of the valence band edge 50 due to the piezoelectric fields. Advantageously, the separation of electrons and holes that occurs in prior art $In_xGa_{1-x}N$ quantum wells is substantially reduced or eliminated in graded $In_xGa_{1-x}N$ quantum wells in accordance with the present invention. In particular, in the embodiment shown in FIG. 4 both electrons and holes in quantum well layer 40 concentrate near its interface with barrier layer 38, and are no longer separated as in the case of prior art devices. Hence, light emitting devices in accordance with embodiments of the present invention may be more efficient than prior art devices.

In another embodiment, the mole fraction of indium in one or more of quantum well layers 36, 40, and 44 is graded to increase with distance from the substrate. For example, the mole fraction of indium in quantum well layer 40 may increase from a first value near the interface between quantum well layer 40 and barrier layer 38 to a second value near the interface between quantum well layer 40 and barrier layer 42. Advantageously, a graded indium concentration which increases through an $In_xGa_{1-x}N$ quantum well in a direction substantially parallel to the wurtzite crystal c-axis at least partially cancels the effect of the piezoelectric field on the valence band edge in the quantum well. This cancellation can be understood similarly to the cancellation of the effect of the piezoelectric field on the conduction band edge described above.

Figure 5:
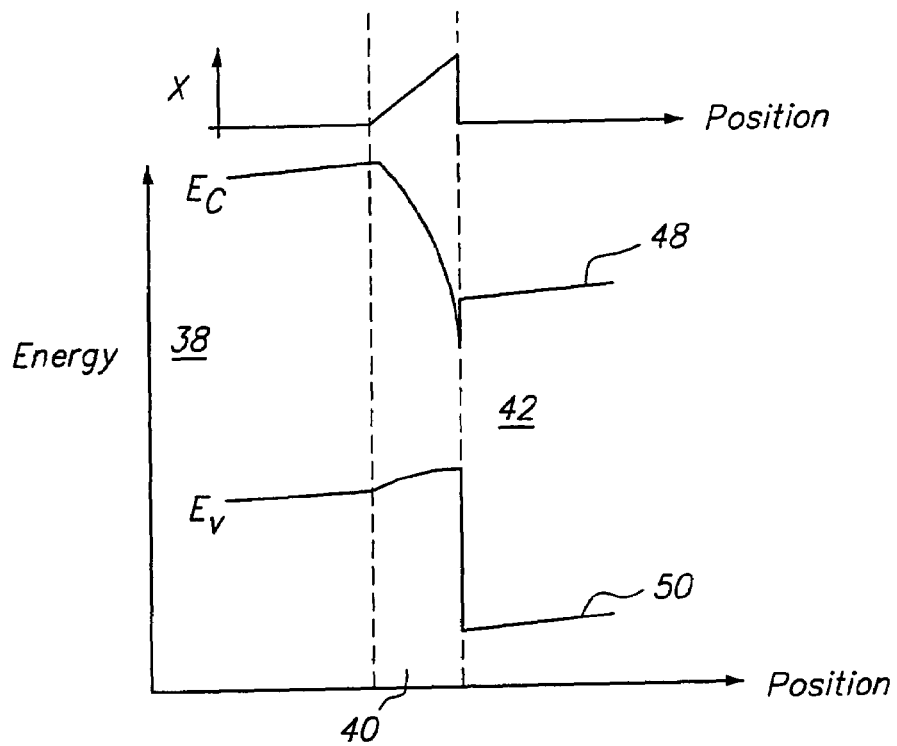
FIG. 5 illustrates a portion of a band structure for a second example of the active region illustrated in FIG. 3.

FIG. 5 shows a schematic band structure of a portion of active region 24 including GaN barrier layers 38 and 42 and an $In_xGa_{1-x}N$ quantum well layer 40 in an embodiment in which the mole fraction of indium in $In_xGa_{1-x}N$ quantum well layer 40 is graded linearly from a value of about zero near its interface with barrier layer 38 to a maximum value near its interface with barrier layer 42. The tilt of valence band edge 50 in quantum well layer 40 has been substantially reduced compared to the tilt of valence band edge 10 of the prior art quantum well layer in FIG. 1. The tilt of the conduction band edge in this embodiment can be understood similarly to the tilt of the valence band edge in the embodiment shown in FIG. 4.

The separation of electrons and holes that occurs in ungraded $In_xGa_{1-x}N$ quantum wells is substantially reduced or eliminated in this embodiment as well. In particular, in this embodiment both electrons and holes in quantum well layer 40 tend to concentrate near its interface with barrier layer 42, and are no longer separated as in the case of prior art devices. Hence, this embodiment also achieves the advantages described above with respect to the embodiments shown in FIG. 4.

The above embodiments demonstrate that it can be advantageous to grade the indium concentration in an $In_xGa_{1-x}N$ quantum well to either increase or decrease in a direction substantially parallel to the wurtzite crystal c-axis. In active regions in which the offset of the conduction band edge in the quantum well and barrier layers is larger than the offset of the valence band edge, it may be more advantageous to grade the indium concentration to decrease in the direction of the c-axis. In active regions in which the offset of the conduction band edge in the quantum well and barrier layers is smaller than the offset of the valence band edge, it may be more advantageous to grade the indium concentration to increase in the direction of the c-axis. It is desirable that the magnitude of the grade invert the tilt in either the conduction band or the valence band.

Although the mole fraction of indium in quantum well layer 40 is graded linearly in the embodiments shown in FIGS. 4 and 5, other functional forms for the position dependence of the indium mole fraction in one or more of the quantum well layers in active region 24 may also be used. For example, the indium mole fraction may grade in an exponential, parabolic, or step-wise manner. Also, although the indium mole fraction decreases or increases monotonically across a quantum well in the embodiments shown in FIGS. 4 and 5, the mole fraction of indium may instead have a global maximum and/or one or more local maxima at one or more intermediate positions in the quantum well. Generally, the position dependence of the mole fraction of indium in an $In_xGa_{1-x}N$ quantum well in accordance with an embodiment of the present invention is asymmetric with respect to a plane parallel to the barrier layers and about centered in the quantum well.

Figure 7:
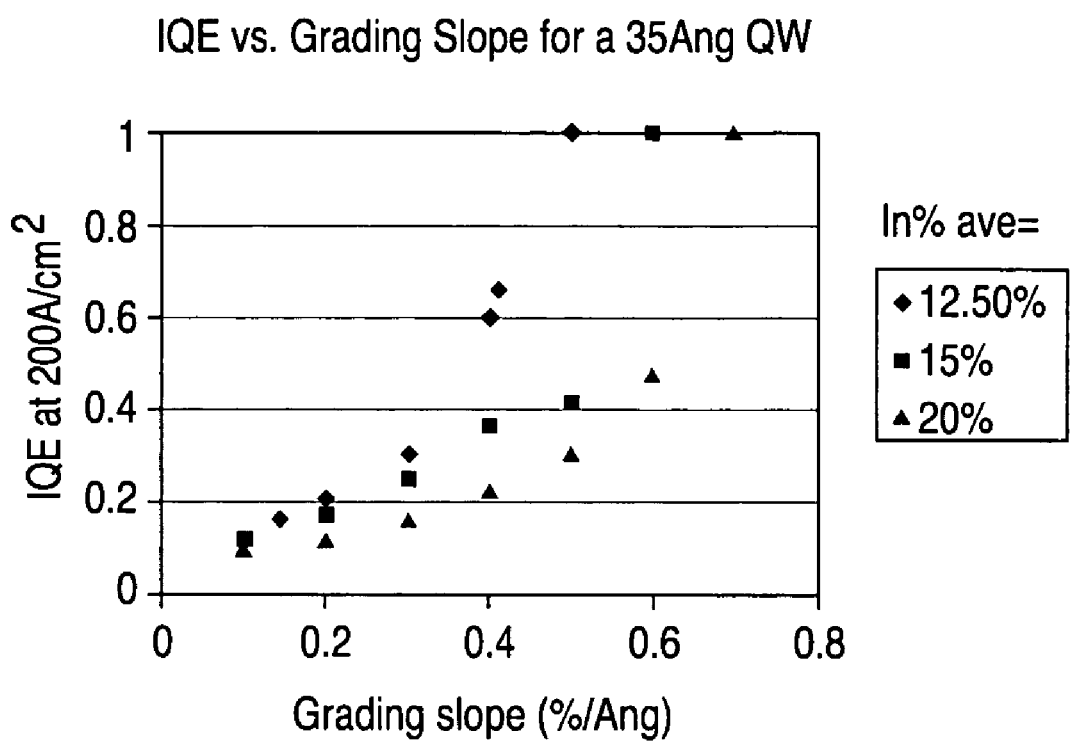
FIG. 7 is a plot of internal quantum efficiency as a function of the slope of compositional grading in an InGaN quantum well layer.

As described above, in III-nitride devices, a sheet charge is generally present at the interface between layers of different composition. It is desirable that the "slope" of the grading in the quantum wells, that is, the percent composition change per unit of thickness, be large enough to counteract the effect of the sheet charges at the interfaces between the quantum well and the surrounding layers. FIG. 7 is a plot of relative internal quantum efficiency as a function of grading slope for computer-modeled InGaN quantum wells having graded compositions of indium. The quantum wells illustrated in FIG. 7 are 35 Å thick. The quantum wells illustrated by diamonds have an average indium composition of 12.5%, the quantum wells illustrated by squares have an average indium composition of 15%, and the quantum wells illustrated by triangles have an average indium composition of 20%.

FIG. 7 illustrates that as the grading slope increases, the internal quantum efficiency of the device increases. An increase in internal quantum efficiency indicates a reduction in the effect of sheet charges in the active region. The internal quantum efficiency of a device with quantum wells graded with a slope of 0.1% indium composition change per angstrom, such as the device of U.S. Pat. No. 6,515,313 discussed in the background section, is quite low, less than 0.2 on the plot of FIG. 7. Accordingly, a grading slope as low as 0.1% apparently does little to counteract the effect of sheet charges in the active region, suggesting that 0.1%/Å is too small a grading slope.

FIG. 7 also illustrates that grading slopes as high as 1%, such as in Published U.S. Application 2003/0020085, are not necessary to achieve high internal quantum efficiency. FIG. 7 illustrates that relative internal quantum efficiencies of 1 can be reached with grading slopes of about 0.5%/Å for a device with 12.5% average indium composition, 0.6%/Å for a device with 15% average indium composition, and 0.7%/Å for a device with 20% average indium composition. Accordingly, FIG. 7 illustrates that for some average indium compositions, the maximum grading slope is preferably less than 1%/Å.

In addition, graded layers with high grading slopes, such as grading slopes greater than 1%/Å, may be difficult to grow. The rate at which the alloy composition can be varied is limited by reactor hardware and the thermal stability of InGaN alloys. In order to achieve the benefit of compositional grading as described in this application, it is necessary that the grading occur in a spatially uniform manner. If, in the plane of the light emitting layer, the rate of compositional grading is not uniform, electrons and holes will collect in some places more probably than in others. This will result in undesirable inhomogeneous emission of light from the active region.

In order to achieve uniformity of composition in the plane of growth, it is necessary to grow the InGaN alloy at a rate which is sufficiently slow to permit the migration of deposited atoms into their lattice positions. If the growth rate is too fast, there will be a high incorporation of C and other undesirable impurities from the source materials and the film thickness will be nonuniform. It is also important not to growth the InGaN alloy too slowly. Indium-containing III-nitride alloys are unstable: they prefer to separate into regions of InN and GaN, and will do so spontaneously. This "spinodal decomposition" process is slow, but does occur at typical growth temperatures. If this alloy segregation occurs, the desired spatial uniformity of the alloy composition and grading will be lost. Accordingly, there is an optimal growth rate of InGaN alloys which is between 0.2 Å/s and 1 Å/s.

In order to form an InGaN light emitting layer with a composition of InN % that varies in the direction perpendicular to the plane of growth, either the gas phase ratio of Indium and Gallium atoms must be varied, or the temperature of the substrate must be varied. The temperature of the growth substrate is typically used to vary the alloy composition, and typical large-scale production growth reactors can change temperature at the rate of 1° C./s. This corresponds to a variation in indium mole fraction of 0.002/s. If the layer is grown at 0.2 Å/s, the minimum growth rate for growth of acceptable quality, for a 25 Å quantum well the growth time is 125 s and the maximum possible alloy variation from one end of the quantum well to the other is 0.25, or 1%/Å. Accordingly, in order to achieve spatially uniform grading during growth at optimal growth rates, the maximum grading slope is preferably less than 1%/Å.

Further, the larger the grading slope, the larger the gradient in strain across the quantum well, because of the increase in equilibrium lattice constant as the indium mole fraction increases. This strain is undesirable because it can cause mechanical failure of the film (generation of dislocations) and can enhance the rate of spinodal decomposition. For example, the maximum indium mole fraction in a 25 Å InGaN quantum well that is uniform in composition and contains no mechanical defects is 0.2. Consequently, a 25 Å InGaN quantum well that is compositionally graded to an indium mole fraction greater than 0.2 may contain dislocations. An indium mole fraction greater than 0.2 may be easily reached in a 25 Å graded quantum well with a grading slope of 1% Å or more.

In accordance with embodiments of the invention, the change in indium composition in an $In_xGa_{1-x}N$ quantum well is at least 0.2% In per Å of quantum well. In a quantum well where the indium composition is graded linearly over the entire thickness of the quantum well, a 25 Å quantum well may have an indium composition change of 5%, a 35 Å quantum well may have an indium composition change of 7%, a 50 Å quantum well may have an indium composition change of 10%, and a 75 Å quantum well may have an indium composition change of 15%. For example, a 25 Å quantum well may be graded from 10–15% indium, a 35 Å quantum well may be graded from 10–17% indium, a 50 Å quantum well may be graded from 10–20% indium, and a 75 Å quantum well may be graded from 5–20% indium. In some embodiments, the thickness of each graded quantum well is less than 40 Å.

In some embodiments, the change in indium composition in an $In_xGa_{1-x}N$ quantum well is at least 0.4% In per Å of quantum well. In a quantum well where the indium composition is graded linearly over the entire thickness of the quantum well, a 25 Å quantum well may have an indium composition change of 10%, a 35 Å quantum well may have an indium composition change of 14%, a 50 Å quantum well may have an indium composition change of 20%, and a 75 Å quantum well may have an indium composition change of 30%. For example, a 25 Å quantum well may be graded from 10–20% indium, a 35 Å quantum well may be graded from 5–20% indium, a 50 Å quantum well may be graded from 0–20% or 5–25% indium, and a 75 Å quantum well may be graded from 0–30% or 5–35% indium.

The mid-point or average indium composition of the graded region in the above-described examples may be shifted to larger compositions of indium for longer wavelength devices, or to smaller compositions of indium for shorter wavelength devices.

Though the above examples describe grading in one or more quantum wells of a multiple quantum well active region, in some embodiments, the quantum well in a device with a single quantum well or a thick light emitting layer that is not a quantum well, in a device with one or more thick light emitting layers, may be graded with the same grading slopes as described above. For example, thick light emitting layers may be, for example, between 100 Å to about 500 Å thick and may be graded with a minimum change in indium composition of 0.2% In per Å or 0.4% In per Å. In some embodiments, a thick light emitting layer may include one or more graded regions and one or more regions of uniform composition. For example a thick light emitting layer may include a graded region at the end of the layer (i.e., the portion of the light emitting layer next to the adjacent device layer) and a region of uniform composition next to the graded region. The graded region may have the same thicknesses and grading slopes described above in the graded quantum well embodiments of the invention. The region of uniform composition may have the same or different composition as the ending composition of the graded region (i.e., the composition in the portion of the graded region closest to the uniform composition region). The region of uniform composition is configured to emit light, and thus has a composition with a band gap narrower than the layers adjacent to the thick light emitting layer. One or both ends of the light emitting layer may be graded regions, separated by a region of uniform composition.

In a graded layer, the charge is distributed across the graded portion of the layer. The internal quantum efficiency of the device may be affected by this distributed charge. In a device where the indium composition increases as the distance from the substrate increases, as illustrated in FIG. 5, the distributed charge is negative. In a device where the indium composition decreases as the distance from the substrate increases, as illustrated in FIG. 4, the distributed charge is positive. The larger the grade, the larger the distributed charge in the layer. The distributed charge can affect electron leakage from a quantum well. Once a quantum well is filled with electrons, additional electrons leak from the well as illustrated by trajectory A of FIG. 1B. A negative distributed charge repels electrons from the quantum well, and may prevent electrons from filling the well faster than electrons are consumed by radiative recombination. In such a quantum well, electron leakage is favorably reduced or eliminated. In contrast, a positive distributed charge attracts electrons to the quantum well, and can increase electron leakage. Accordingly, in some embodiments it is preferable to grade the quantum well layer with a composition of indium that increases as the distance from the substrate increases, such that the distributed charge in the quantum well is negative. The device illustrated in FIG. 5 is grown on the gallium face of a GaN-based wurtzite crystal, which results from, for example, conventional growth on a c-plane sapphire substrate. In devices grown on the nitrogen face of a GaN-based wurtzite crystal, the sheet charges have the opposite sign, such that it is preferable to grade the quantum well layer with a composition of indium that decreases as the distance from the substrate increases.

Though the above examples describe grading of indium in InGaN quantum wells with InGaN or GaN barrier layers, compositional grading may be applied to devices with active regions of other compositions, for example InGaN quantum wells and AlGaN barrier layers, GaN quantum wells and AlGaN barrier layers, and AlGaN quantum wells and AlGaN barrier layers. The sheet charge at the interface between an InGaN quantum well and an AlGaN barrier layer tends to be larger than the sheet charge between the same InGaN quantum well and a GaN barrier layer. For example, the sheet charge at the interface between an $Al_{0.08}Ga_{0.82}N$ barrier and an $In_{0.08}Ga_{0.82}N$ quantum well is twice the magnitude of the sheet charge at the interface between a GaN barrier and an $In_{0.08}Ga_{0.82}N$ quantum well. Accordingly, in a device with InGaN quantum wells and AlGaN barrier layers, the amount of indium in the quantum well may be graded at twice the slopes described above for a device with InGaN quantum wells and GaN barrier layers. In general, the indium composition in the quantum well is graded from a maximum in a portion of the quantum well closest to the substrate to a minimum in a portion of the quantum well closest to the p-type layers in the device. In a device with AlGaN barriers and GaN quantum wells, the quantum wells may be graded with aluminum to at least partially cancel the sheet charge at the quantum well/barrier layer interface. In general, the aluminum composition in the quantum well is graded from a maximum in a portion of the quantum well closest to the substrate to a minimum in a portion of the quantum well closest to the p-type layers in the device. The minimum aluminum composition may be zero, resulting in GaN. The thicknesses and grading slopes described above in the graded quantum well embodiments and thick light emitting layer embodiments may be applied to devices with AlGaN/GaN light emitting layers, where Al substitutes for In as the graded element.

In some embodiments, a quaternary light emitting layer, such as $In_xAl_yGa_{1-x-y}N$ may have a composition graded in a direction substantially perpendicular to the layers. The mole fraction of aluminum, indium, or both may be graded. The change in indium or aluminum composition in an $In_xAl_yGa_{1-x-y}N$ quantum well when the composition of only one material (aluminum or indium) is graded may be at least 0.2% per A, and more preferably at least 0.4% per Å. When only the aluminum composition is graded, the indium composition is held constant across the layer. Similarly, when only the indium composition is graded, the aluminum composition is held constant across the layer. When both aluminum and indium composition are graded, the compositions of indium and aluminum are generally graded in opposite directions. For example, if the composition of indium increases with distance from the substrate, the composition of aluminum decreases with distance from the substrate. When both aluminum and indium composition are graded, the grading slopes of indium and aluminum may be less than in layers where only a single material is graded. For example, the change in each of aluminum and indium may be at least 0.1% per Å.

In some embodiments, active region 24 includes one or more graded composition quantum well layers and one or more graded composition barrier layers. The graded composition barrier layers may be graded across their entire thickness, or the graded composition barrier layers may contain regions of graded composition and regions of uniform composition. For example, one or both ends of the barrier layers (i.e., the portions of the barrier layers closest to the quantum wells) may be graded to adjust the height of the barrier between the barrier and each quantum well. The graded ends of the barrier layer may be separated by a region of uniform composition. The graded regions of the barrier layers may be graded with the same grading slopes described above. In a device with InGaN quantum wells and GaN barriers, the barriers may be graded with indium or aluminum. In a device with GaN quantum wells and AlGaN barriers, the barriers may be graded with aluminum.

The various $In_xAl_yGa_{1-x-y}N$ layers in a light emitting device according to embodiments of the present invention may be formed by, for example, metal-organic chemical vapor deposition (MOCVD) or molecular beam epitaxy (MBE). Graded composition quantum well and barrier layers may be formed, for example, by varying the flow rates of reagent gases during layer deposition.

Figure 6:
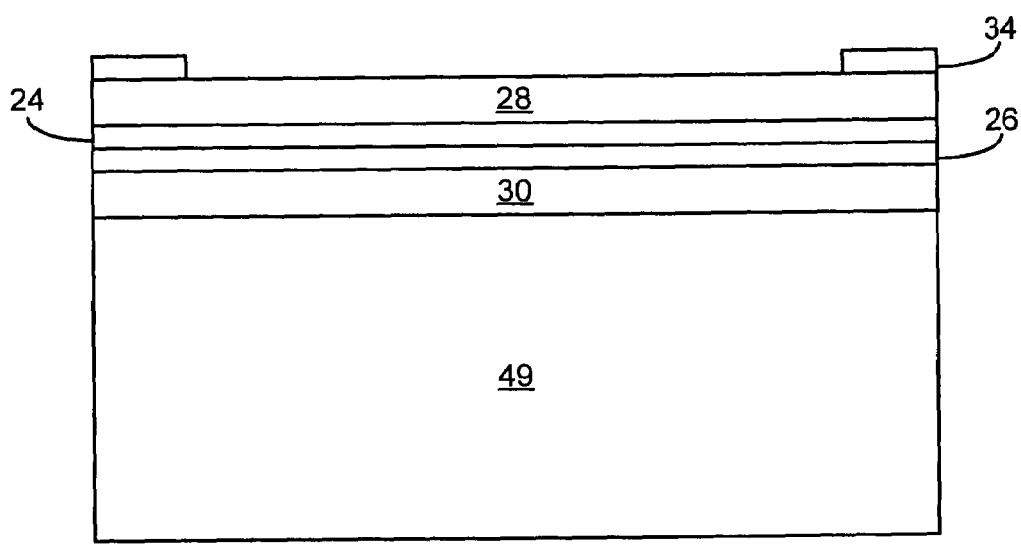
FIG. 6 is a cross sectional view of a light emitting device according to embodiments of the invention.

FIG. 6 illustrates an alternate embodiment of a semiconductor light emitting device incorporating any of the graded active regions described above. In the device of FIG. 6, the epitaxial layers are bonded to a host substrate 49, then the growth substrate (not shown) is removed. Growth substrate removal is described in more detail in application Ser. No. 10/804,810, filed Mar. 19, 2004, titled "Photonic Crystal Light Emitting Device," assigned to the assignee of the present invention, and incorporated herein by reference.

While the present invention is illustrated with particular embodiments, the invention is intended to include all variations and modifications falling within the scope of the appended claims. For example, an $In_xAl_yGa_{1-x-y}N$ light emitting device in accordance with the present invention may have, in contrast to LED 16 of FIG. 2, a structure in which an n-type region overlies a p-type region, which overlies a substrate. The light emitting device may be a laser diode. Graded composition active regions in accordance with the present invention may also be formed in other material systems such as other III–V material systems and II–VI material systems. Such graded active regions can be particularly advantageous in piezoelectric material systems and in material systems having a spontaneous polarization.

What is being claimed is:

1. A semiconductor light emitting device comprising a III-nitride light emitting layer disposed between an n-type region and a p-type region, the light emitting layer having a graded composition of a first element, wherein a change in composition of the first element in the light emitting layer is greater than 0.2% per angstrom and less than 0.8% per angstrom across a thickness of the light emitting layer.

2. The device of claim 1 wherein a change in composition of the first element in the light emitting layer is at least 0.4% per angstrom across a thickness of the light emitting layer.

3. The device of claim 1 wherein the light emitting layer is $In_xGa_{1-x}N$ and the first element is indium.

4. The device of claim 1 wherein a change in composition of the first element in the light emitting layer is at least 0.6% per angstrom across a thickness of the light emitting layer.

5. The device of claim 1 wherein the light emitting layer has a thickness between 10 angstroms and 100 angstroms.

6. A semiconductor light emitting device comprising a III-nitride light emitting layer disposed between an n-type region and a p-type region, the light emitting layer having a graded composition of a first element, wherein a change in composition of the first element in the light emitting layer is greater than 0.2% per angstrom and less than 1% per angstrom across a thickness of the light emitting layer, wherein the light emitting layer has a thickness between 100 angstroms and 500 angstroms.

7. The device of claim 1 wherein the light emitting layer is $In_xAl_yGa_{1-x-y}N$.

8. The device of claim 7 wherein the first element is aluminum.

9. The device of claim 7 wherein the first element is indium.

10. The device of claim 9 wherein a composition of aluminum in the light emitting layer is graded.

11. The device of claim 1 wherein the light emitting layer is a first quantum well, the device further comprising:
 a second quantum well; and
 a barrier layer disposed between the first quantum well and the second quantum well.

12. The device of claim 11 wherein a composition in the barrier layer is graded.

13. The device of claim 11 wherein the berrier layer comprises a first portion having a graded composition and a second portion having a substantially uniform composition.

14. The device of claim 13 wherein the first portion is located adjacent to one of the first and second quantum wells.

15. The device of claim 1 wherein the light emitting layer is $Al_xGa_{-x}N$ and the first element is aluminum.

16. A semiconductor light emitting device comprising a III-nitride light emitting layer disposed between an n-type region and a p-type region, the light emitting layer having a graded composition of a first element, wherein a change in composition of the first element in the light emitting layer is greater than 0.2% per angstrom and less than 1% per angstrom across a thickness of the light emitting layer, wherein the light emitting layer is a first portion of a III-nitride light emitting region, the light emitting region further comprising a second portion of uniform composition.

17. The device of claim 16 wherein the first portion has a thickness between 10 and 100 angstroms.

18. The device of claim 16 wherein the first portion is located at an end of the light emitting region closest to the n-type region.

19. The device of claim 16 wherein the first portion is located at an end of the light emitting region closest to the p-type region.

20. The device of claim 16 wherein:
 the light emitting region further comprises a third portion, the third portion having a graded composition of a first element; and
 the second portion is disposed between the first and third portions.

* * * * *

UNITED STATES PATENT AND TRADEMARK OFFICE
CERTIFICATE OF CORRECTION

| | | |
|---|---|---|
| PATENT NO. | : 7,122,839 B2 | Page 1 of 1 |
| APPLICATION NO. | : 10/977867 | |
| DATED | : October 17, 2006 | |
| INVENTOR(S) | : Yu-Chen Shen, Michael R. Krames and Nathan F. Gardner | |

It is certified that error appears in the above-identified patent and that said Letters Patent is hereby corrected as shown below:

Column 12, line 1: Cancel "berrier" and substitute --barrier--;

Column 12, line 8: Cancel "$Al_xGa_{-x}N$" and substitute --$Al_xGa_{1-x}N$--.

Signed and Sealed this

Twenty-fourth Day of April, 2007

JON W. DUDAS
*Director of the United States Patent and Trademark Office*